(12) United States Patent
Chang

(10) Patent No.: US 6,802,322 B2
(45) Date of Patent: Oct. 12, 2004

(54) METHOD OF FABRICATING A STRINGERLESS FLASH MEMORY

(75) Inventor: Ching-Yu Chang, I-Lan Hsien (TW)

(73) Assignee: Macronix International Co., Ltd., Hsin-Chu (TW)

(*) Notice: Subject to any disclaimer, the term of this patent is extended or adjusted under 35 U.S.C. 154(b) by 402 days.

(21) Appl. No.: 10/063,129

(22) Filed: Mar. 25, 2002

(65) Prior Publication Data

US 2003/0181047 A1 Sep. 25, 2003

(51) Int. Cl.⁷ .......................... H01L 21/302; B08B 6/00
(52) U.S. Cl. .................. 134/1.2; 134/1.3; 438/714; 438/725; 438/734; 438/750; 438/696
(58) Field of Search .................. 134/1.2, 1.3; 438/696, 438/714, 725, 734, 750

(56) References Cited

U.S. PATENT DOCUMENTS

| | | | | |
|---|---|---|---|---|
| 6,004,878 A | * | 12/1999 | Thomas et al. | 438/655 |
| 6,191,444 B1 | * | 2/2001 | Clampitt et al. | 257/315 |
| 6,699,753 B2 | * | 3/2004 | Ma et al. | 438/257 |

* cited by examiner

Primary Examiner—George A. Goudreau
(74) Attorney, Agent, or Firm—Winston Hsu

(57) ABSTRACT

A stringer block is formed on the interface between a HDP silicon oxide layer and a silicon substrate. During an etching process for defining the profile of a floating gate, the stringer block functions to expose a bottom corner stringer. Following that, a polysilicon etching process effectively removes the bottom corner stringer. As a result, a stringerless flash memory cell is formed to prevent leakage currents, resulting from the bottom corner stringer, and improve both the reliability and data retention ability of the device.

13 Claims, 15 Drawing Sheets

METHOD OF FABRICATING A STRINGERLESS FLASH MEMORY

BACKGROUND OF INVENTION

1. Field of the Invention

The present invention relates to a method of fabricating a flash memory, and more particularly, to a method of fabricating a stringerless flash memory to prevent stringer leakage and improve data retention ability.

2. Description of the Prior Art

EEPROM (electrically erasable programmable read only memory) is a very popular memory device used in the electronics industry due to its ability to store data in a non-volatile manner for more than 10 years, and with the capability of being reprogrammed or erased many times. However, one disadvantage of EEPROM devices is their slow memory access time compared to other memory devices. In order to solve this problem, a flash EEPROM device was developed by Intel. In contrast to the traditional EEPROM, the flash EEPROM can erase recorded data a block at a time instead of a byte at a time, to dramatically increase the memory access speed.

Please refer to FIG. 1. FIG. 1 is a cross-sectional diagram of a prior flash memory cell 30. As shown in FIG. 1, the flash memory cell 30 comprises a substrate 10, a floating gate 17, an ONO dielectric layer 18 and a polysilicon word line 20. The floating gate 17, comprising a first polysilicon layer 14 and a second polysilicon layer 16, is positioned between an insulating layer 12a and 12b. Doped regions 11a and 11b, function as a bit line of the flash memory cell 30, are formed beneath the insulating layer 12a and 12b, respectively. The doped regions 11a and 11b may also function as a buried drain. In addition, an oxide layer 13 is positioned between the floating gate 17 and the substrate 10. Hot electrons tunnel through the oxide layer 13 to get in or get out of the floating gate 17, thus achieving data accessing.

However during the fabrication process of the flash memory cell 30, a polysilicon residue 22 occurs to induce current leakage problems, so the data retention ability of the memory cell is thus reduced. Please refer to FIG. 1, while the insulating layer 12a and 12b intersect the substrate 10 at an angle θ greater than 90 degrees, the polysilicon residue 22 will remain on the side wall of the insulating layer 12a and 12b as a result of an etching process to define patterns of the word line 20, the first polysilicon layer 14 and the second polysilicon layer 16. The polysilicon residue 22 may also be called a stringer.

SUMMARY OF INVENTION

It is therefore a primary objective of the present invention to provide a method of fabricating a flash memory to solve the above-mentioned problems.

It is another objective of the present invention to provide a method of fabricating a stringerless flash memory to achieve better reliability for the flash memory.

It is another objective of the present invention to provide a method of fabricating a stringerless flash memory to increase the process window.

According to the claimed invention, a semiconductor substrate is first provided. A silicon oxide layer is formed on the semiconductor substrate. After that, a plurality of rows of layer stacks is formed on the silicon oxide layer, a shallow trench being formed between two adjacent layer stacks. Each layer stack comprises a first polysilicon layer and a sacrificial layer, and has two side walls. Wherein, each side wall of the layer stack intersects the bottom of the shallow trench at an angle greater than 90 degrees. Then, a spacer is formed on each side wall of the layer stacks followed by the deposition of a high density plasma (HDP) silicon oxide layer to cover the layer stacks and the shallow trenches. The HDP silicon oxide layer is planarized to expose the sacrificial layer. The sacrificial layer and a portion of the spacer are removed, such that a remainder of the spacer forms a stringer block. Thereafter, a second polysilicon layer is formed on the first polysilicon layer, the first polysilicon layer combining with the second polysilicon layer to form a floating gate layer. An insulating layer and a controlling gate layer are formed on the floating gate layer, then an anisotropic dry etching process is performed to remove portions of the controlling gate layer, the insulating layer and the floating gate layer. Following the etching process of the floating gate layer, a bottom corner stringer is formed beside the stringer block during. Finally, the stringer block is removed to expose the bottom corner stringer followed by removal of the bottom corner stringer.

It is an advantage of the present invention that the stringer block is formed on the interface between the HDP silicon oxide layer and the silicon substrate. Thus, the bottom corner stringer can be exposed following the removal of the stringer block and removed by a dry etching process. As a result, a stringerless flash memory cell is formed to prevent leakage currents resulting from the bottom corner stringers according to the present invention. In addition, both the reliability and data retention ability of the flash memory cell are effectively improved.

These and other objectives of the present invention will no doubt become obvious to those of ordinary skill in the art after reading the following detailed description of the preferred embodiment, that is illustrated in the various figures and drawings.

DETAILED DESCRIPTION

Please refer to FIG. 2 to FIG. 12. FIG. 2 to FIG. 12 are schematic diagrams of a better embodiment of the present invention to fabricate a flash memory cell on a silicon substrate 50. Wherein, FIG. 7B is a side view of FIG. 7A. FIG. 8B is a side view of FIG. 8A. Generally, the silicon substrate 50 comprises both a memory area and a periphery area. To emphasize the features of the present invention, only a relative portion within the memory area is magnified and shown in FIG. 2 to FIG. 12. The other portions of the silicon substrate 50, such as the periphery area, are not shown in FIG. 2 to FIG. 12.

Figure 1:
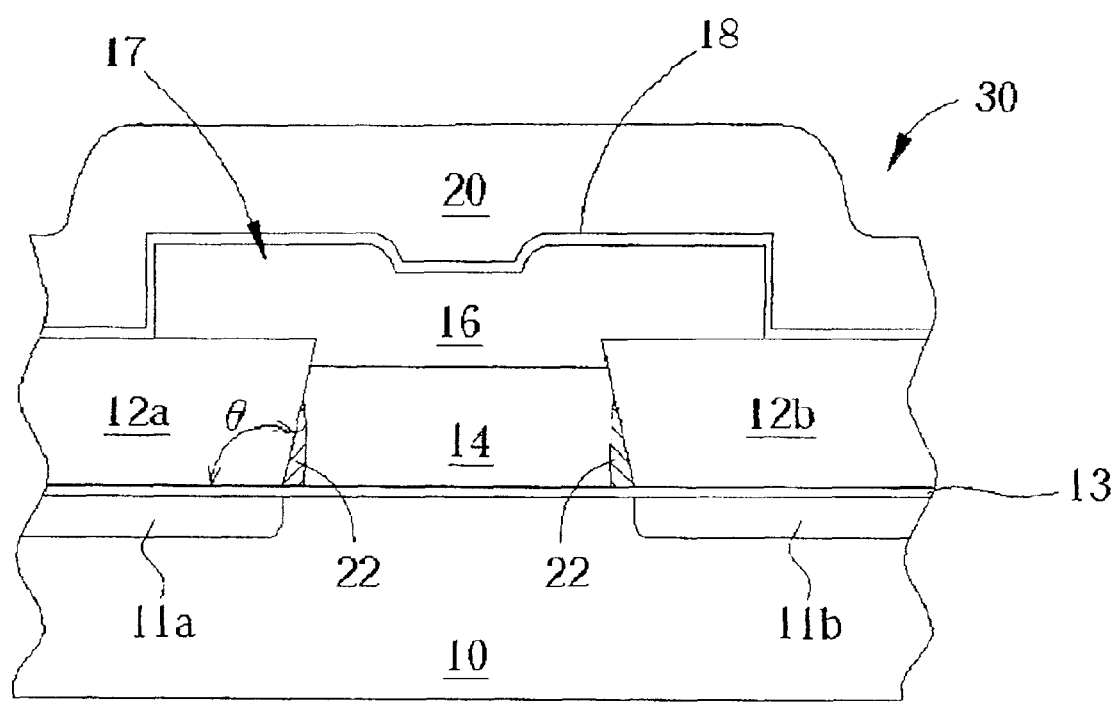
FIG. 1 is a cross-sectional diagram of a prior flash memory cell.
Figure 2:
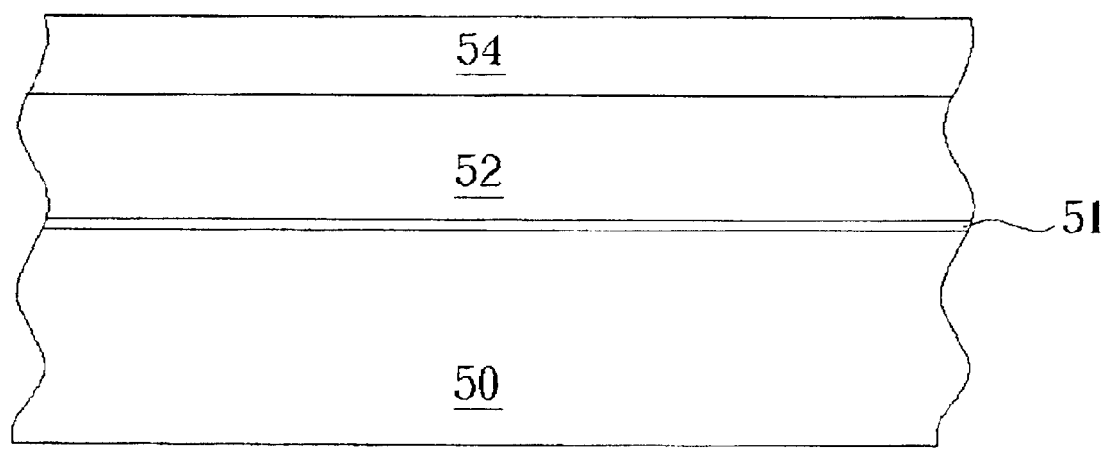
FIG. 2 to FIG. 12 are schematic diagrams of a method of fabricating a flash memory cell according to the present invention.

First, as shown in FIG. 2, an oxide layer 51 is formed on the surface of the silicon substrate 50. The oxide layer 51, functioning as a tunneling oxide layer adjacent to a floating gate, has a thickness of approximately 30 to 150 angstroms (Å). The oxide layer 51 is formed by a wet oxidation method or a dry oxidation method. The silicon substrate 50 is a lightly doped P-type single crystal silicon substrate with a <100> surface. Alternatively, the silicon substrate 50 is a silicon-on-insulator (SOI) substrate formed by a well-known SIMOX method.

Next, a polysilicon layer 52 with a thickness of 800 to 1600 Å is deposited on the surface of the oxide layer 51. A LPCVD is used to deposit the polysilicon layer 52 with silane ($SiH_4$) as reactive gas, at a temperature of 570 to 650° C., and a pressure of 0.3 to 0.6 Torrs. Following that, a silicon nitride layer 54 is deposited on the surface of the polysilicon layer 52. A CVD process is used to form the silicon nitride layer 54 of 400 to 1500 Å in thickness. In addition, the silicon nitride layer 54 functions as a sacrificial layer and will be removed in a later process.

Figure 3:
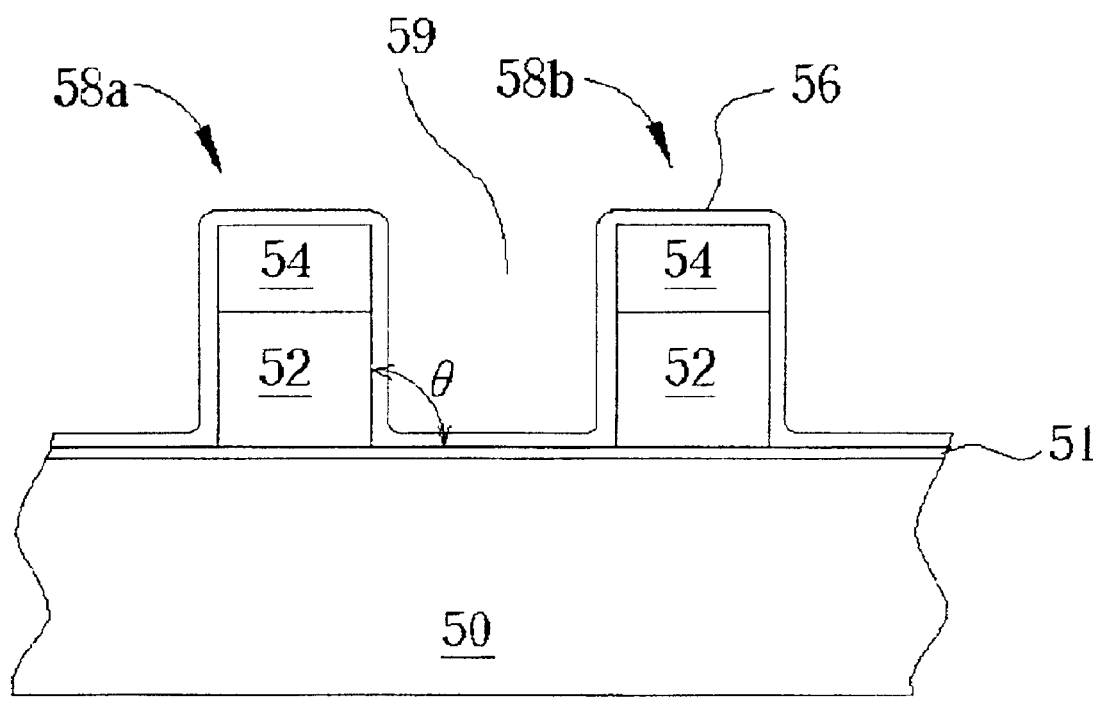

As shown in FIG. 3, a lithographic process is performed to form a photoresist layer (not shown). The photoresist layer is patterned so as to define the position and channel length of the floating gate. Thereafter, a reactive ion etching (RIE) process is performed to etch portions of the silicon nitride layer 54 and the polysilicon layer 52 not covered by the photoresist layer. As a result, a plurality of rows of stacked structures 58a and 58b are formed on the silicon substrate 50 within the memory area. Between the stacked structure 58a and the stacked structure 58b, a shallow trench 59 with a width of 0.15 to 0.2 micrometers is formed. Therein, the bottom of the shallow trench 59 intersects each side wall of the stacked structures 58a and 58b at an angle θ. The angle θ is a little bit greater than 90 degrees, so that the stringer easily forms in a later process. Subsequently, the photoresist layer is removed followed by the use of a CVD to deposit a silicon nitride layer 56 to cover the stacked structure 58a, the stacked structure 58b, and the bottom of the shallow trench 59. The silicon nitride layer 56 is approximately 50 to 200 Å in thickness. A preferable thickness is suggested 100 Å for the silicon nitride layer 56.

Figure 4:
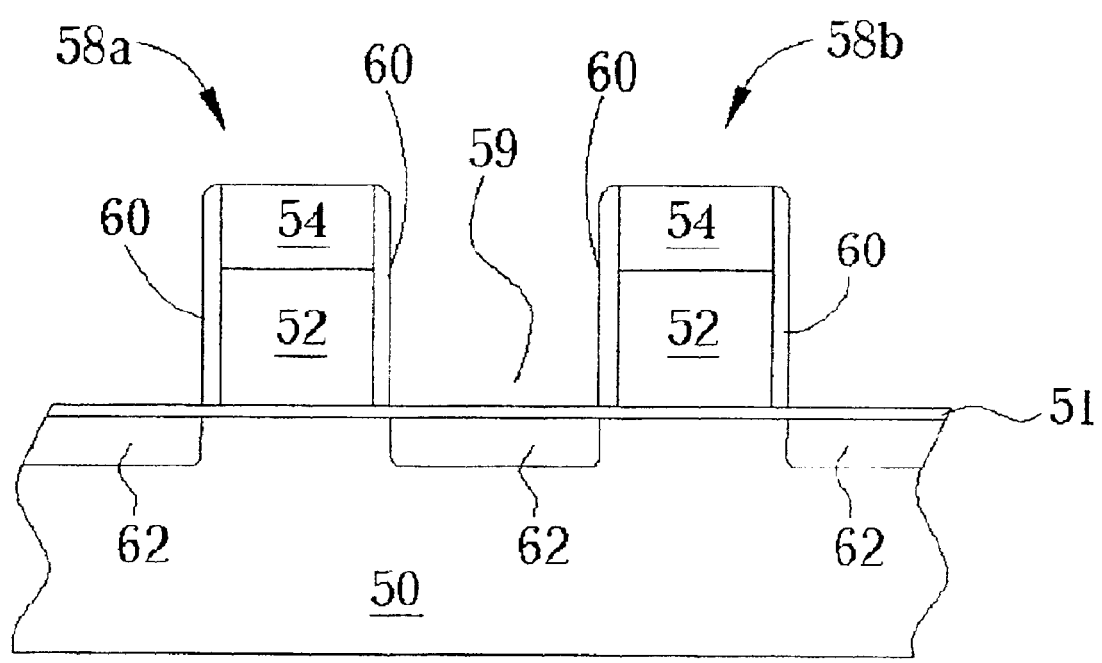

As shown in FIG. 4, an etching back process is then performed to etch back the silicon nitride layer 56, so as to form a silicon nitride spacer 60 on each side wall of the of the stacked structures 58a and 58b. The thickness of the silicon nitride spacer 60 ranges from 70 to 120 Å approximately. Thereafter, an ion implantation process is performed to implant dopants with a predetermined concentration into the silicon substrate 50 so as to form a doping region 62. The doping region 62 functions as a bit line or a buried drain. The ion implantation process uses arsenic ions with an implantation energy of 50 to 150 KeV and an implantation dosage of 1E14 to 1E17 ions/$cm^2$, and is performed one or more times in a vertical direction at room temperature. Alternatively, other N-type ions, such as phosphorus ions, can be used in the ion implantation process.

Figure 5:
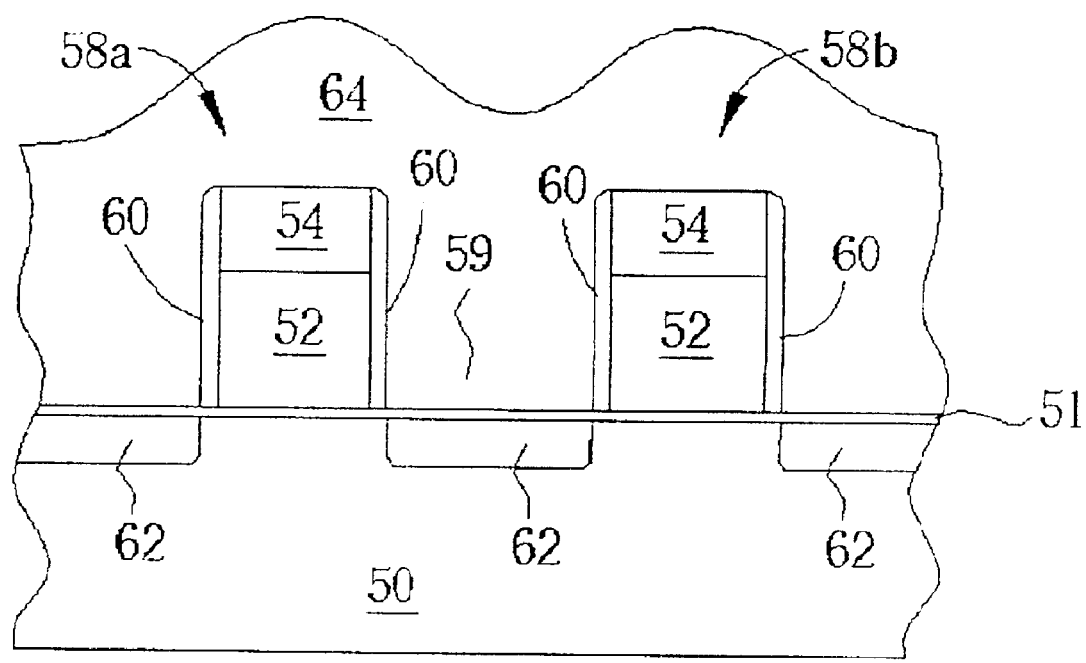
Figure 6:
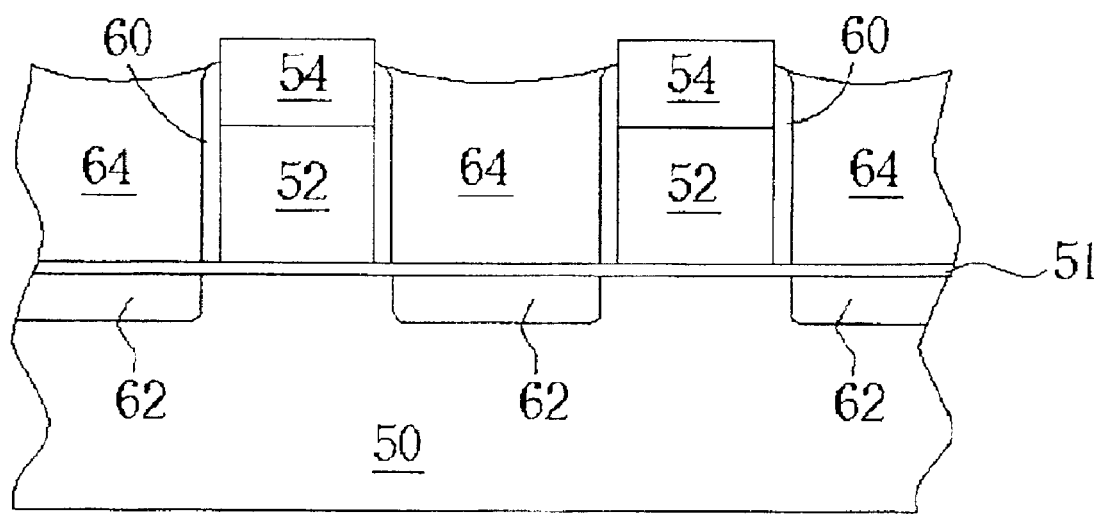

Following the ion implantation process, as shown in FIG. 5, a high-density plasma chemical vapor deposition (HDPCVD) is performed to deposit a HDP silicon oxide layer 64 to fill the shallow trench 59. Subsequently, as shown in FIG. 6, using the silicon nitride layer 54 as a stop layer, a chemical mechanical polishing (CMP) process is performed to polish the HDP silicon oxide layer 64 so as to expose the silicon nitride layer 54. During the CMP process, an over-polishing time may be adopted depending on the process design, so as to prevent wafer-to-wafer variation or die-to-die variation. Generally, an over-etching time ranging from 5 to 25 seconds is suggested. After the CMP process, the remainder of the HDP silicon oxide layer 64 may have a concave surface. However, the concave surface of the HDP silicon oxide layer 64 does not negate the advantages of the present invention.

Figure 7A:
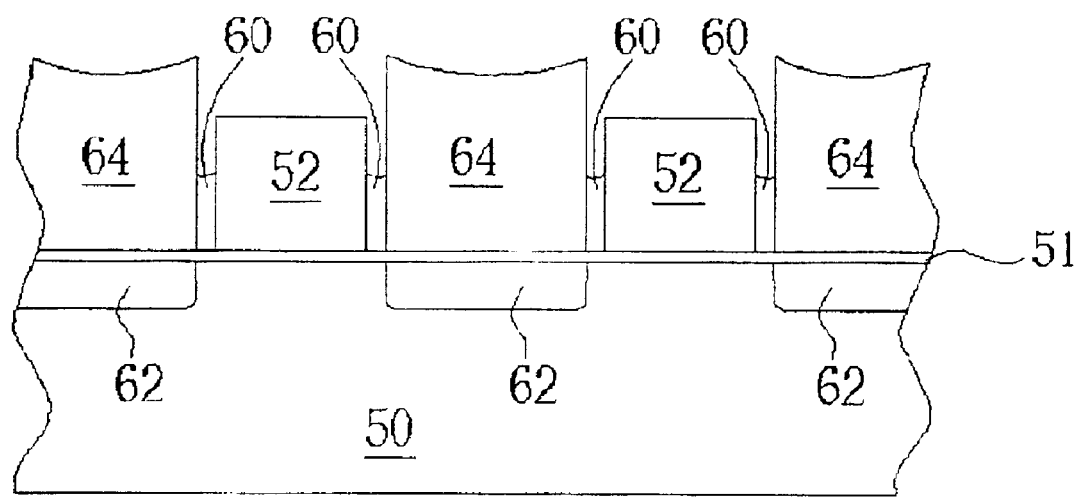
Figure 7B:
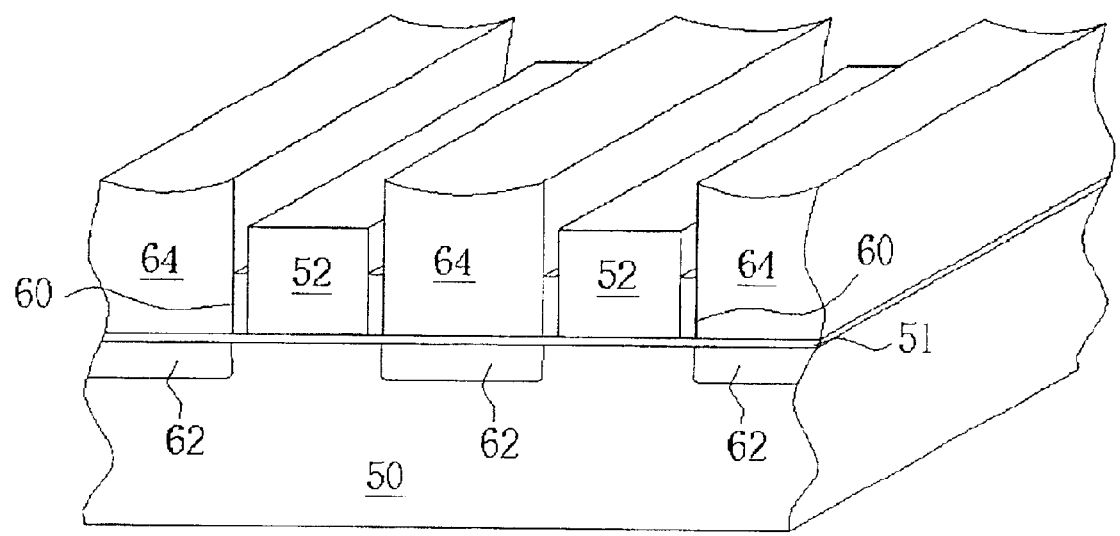

Then, as shown in FIG. 7A and FIG. 7B (FIG. 7B is a side view of FIG. 7A), a wet etching process is performed using hot phosphoric acid ($H_3PO_4$) of 150 to 180° C. to completely strip the silicon nitride layer 54. The wet etching process, operating in an etching tank (not shown), lasts an immersion time of seconds to minutes, depending on the thickness of the silicon nitride layer 54. Alternatively, other wet etching processes can be used to remove the silicon nitride layer 54. During the wet etching process, a portion of the silicon nitride spacer 60 is also removed. The remainder of the silicon nitride layer has a height of approximately 200 to 800 Å, functioning as a stringer block in a later process.

Figure 8A:
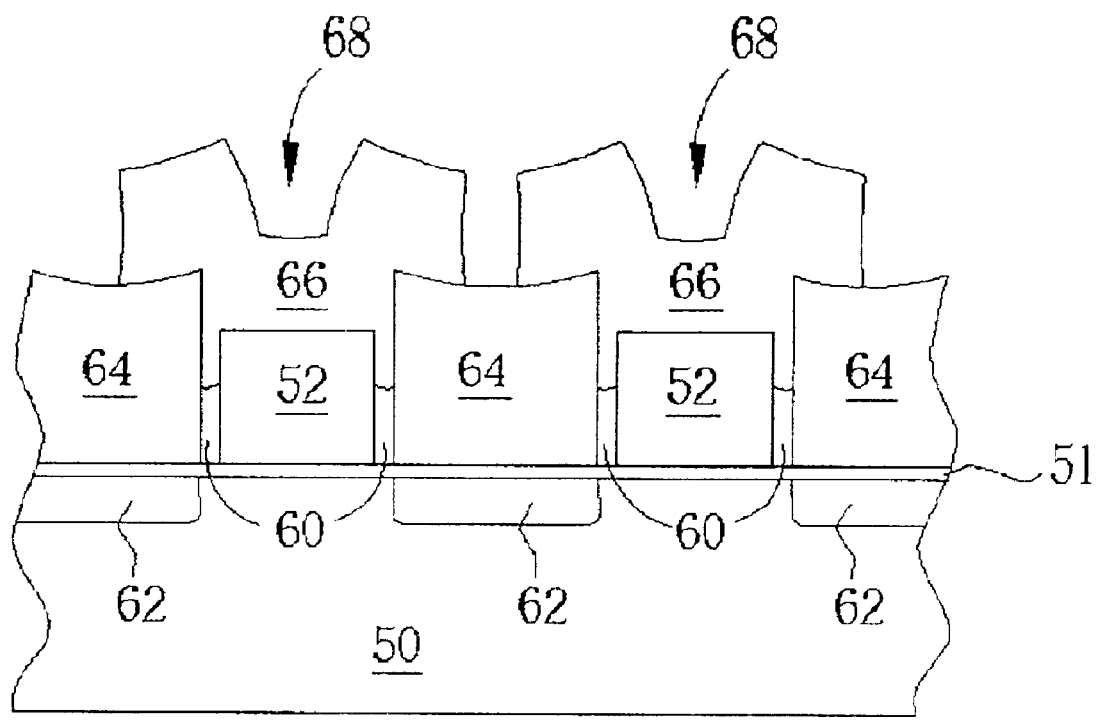
Figure 8B:
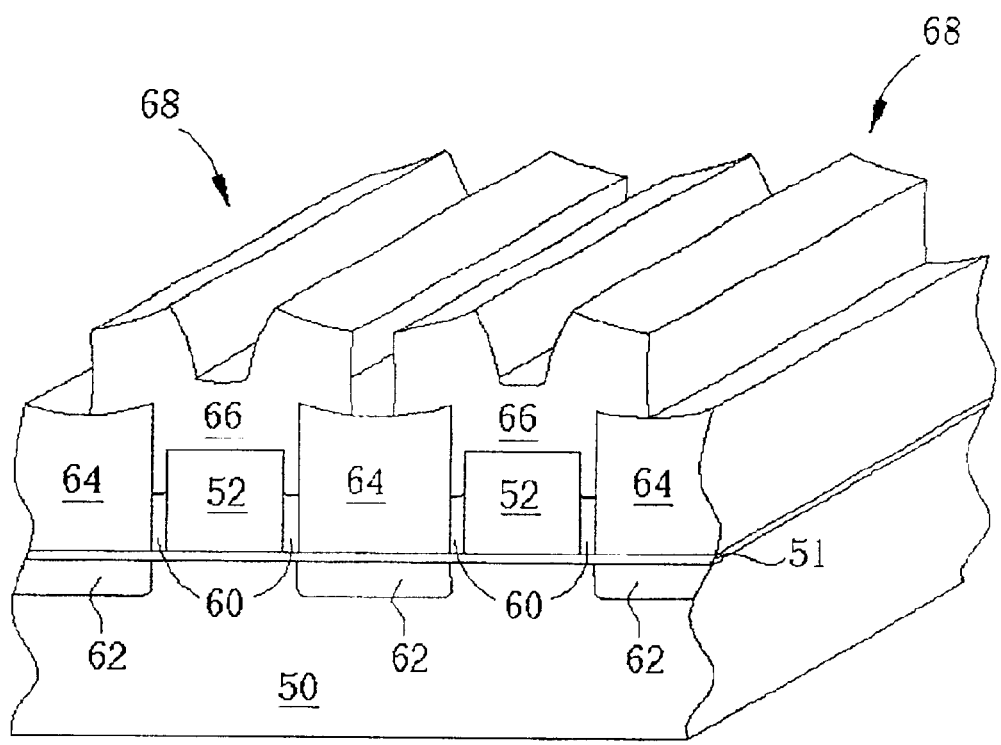

As shown in FIG. 8A and FIG. 8B (FIG. 8B is a side view of FIG. 8A), a polysilicon layer 66 with a thickness of 500 to 1200 Å is formed on the polysilicon layer 52. A CVD method, such as LPCVD, a photolithographic process and an etching process are used respectively so as to form the polysilicon layer 66. Following that, a floating gate 68, composing the polysilicon layer 52 and the polysilicon layer 66, is formed.

Figure 9A:
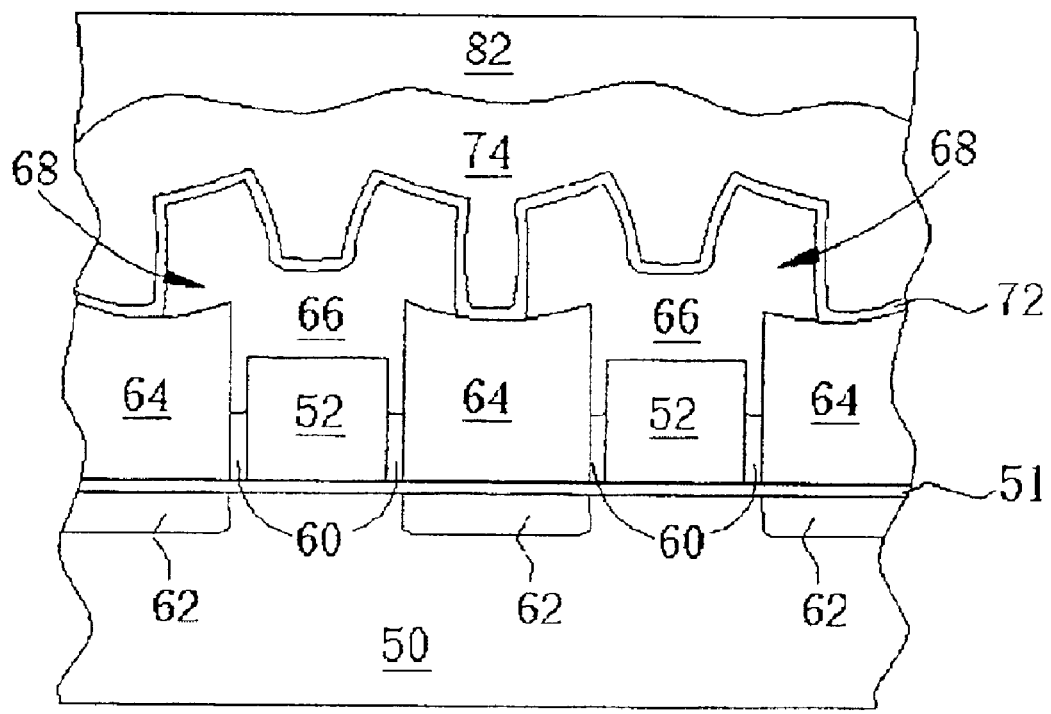
Figure 9B:
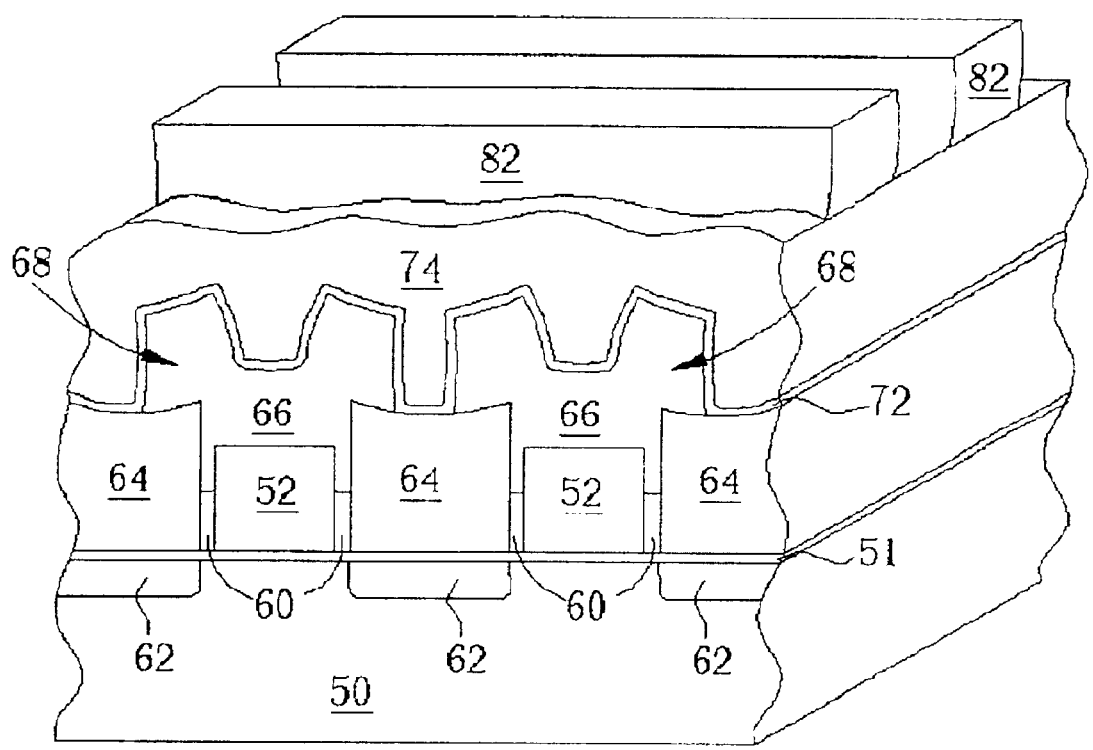

Thereafter, as shown in FIG. 9A and FIG. 9B (FIG. 9B is a side view of FIG. 9A), an ONO dielectric layer 72 and a doped polysilicon layer 74 are formed, respectively, on the surface of the polysilicon layer 66. A photoresist layer 82 with patterns for forming a word line is then formed on the doped polysilicon layer 74. The doped polysilicon layer 74, functioning as a word line or a controlling gate of a flash memory cell, attains a required doping concentration by using an in-situ doping CVD or an independent ion implantation process after the CVD.

The ONO dielectric layer 72 is formed by a normal ONO (oxidized-silicon nitride-silicon oxide) process. During the ONO process, an oxide layer with a thickness of 10 to 50 Å is first formed on the surface of the polysilicon layer 66. Thereafter, a silicon nitride layer (not shown) with a thickness of approximately 45 Å is formed on the oxide layer. The silicon nitride layer is formed by a plasma-enhanced CVD (PECVD) or LPCVD using dichlorosilane ($SiH_2Cl_2$) and ammonia (NH ) as reactive gases. Finally, a silicon oxy-nitride layer with a thickness of 40 to 80 Å is formed on the silicon nitride layer. The silicon oxy-nitride layer is formed by performing a thermal healing process lasting thirty minutes in an oxygen environment at a high temperature of 800° C. The silicon oxy-nitride layer functions to repair defects within the silicon nitride layer as well as to reduce leakage currents. Alternatively, the ONO dielectric layer 72 can be formed by other methods.

Figure 10:
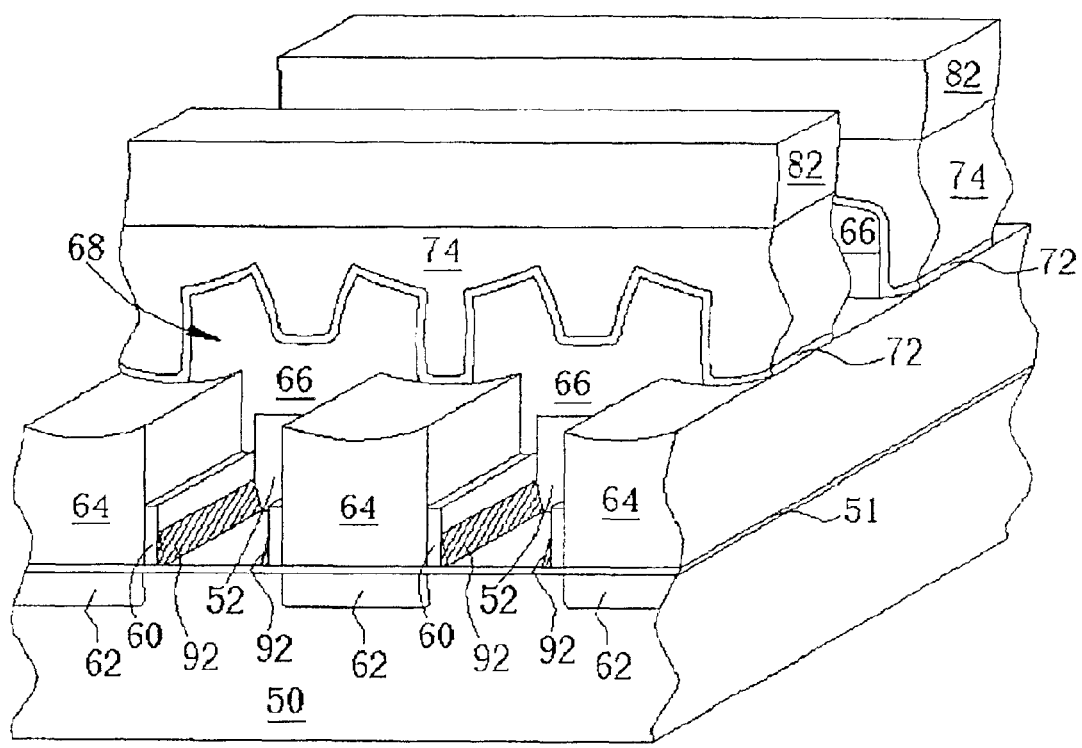

Subsequently, as shown in FIG. 9B and FIG. 10, using the photoresist layer 82 as an etching mask, a reactive ion etching (RIE) process is performed to remove portions of the doped polysilicon layer 74, the ONO dielectric layer 72, and the floating gate 68 (including the polysilicon layers 66 and 52). During the RIE process, a selected etching rate of silicon oxide to polysilicon as great as possible is suggested.

Figure 11:
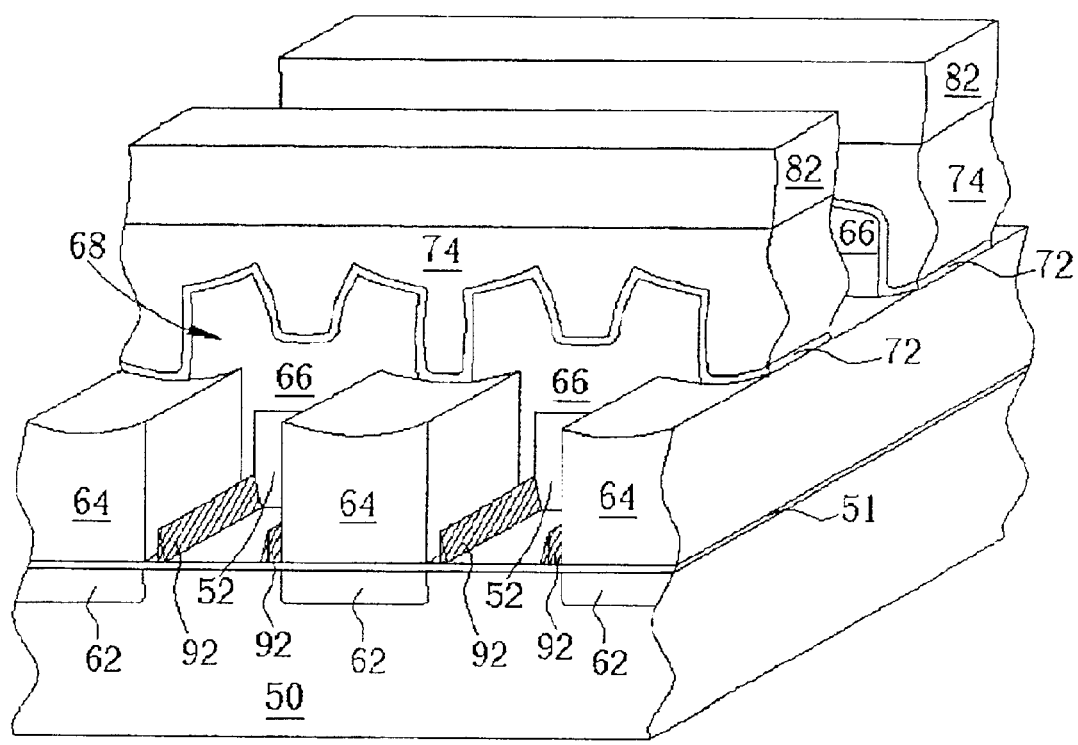

In FIG. 10, after the etching process of the floating gate 68 is finished, smaller polysilicon stringer pieces 92 are still formed at the side wall corner of the stringer block 60. As shown in FIG. 11, the stringer block 60 is removed by a dry etching process or a wet etching process. While using the wet etching process, hot phosphoric acid ($H_3PO_4$) of 150 to 180° C. is most often used to completely strip the silicon nitride stringer block 60. Following that, the polysilicon stringer 92 positioned at the side wall corner of the stringer block 62 is exposed.

Figure 12:
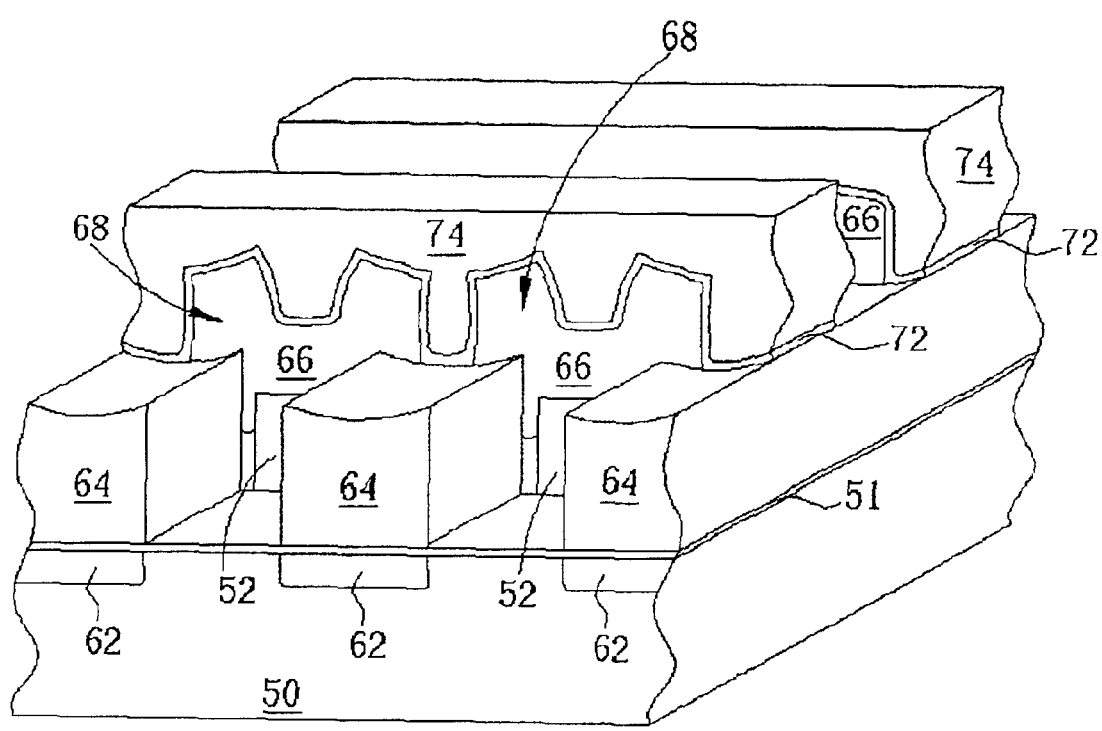

Finally, as shown in FIG. 12, a dry etching process is performed to remove the polysilicon stringer pieces 92 followed by the removal of the photoresist layer 82, and thus fabrication of the stringerless flash memory cell is finished. As for further processes, such as the fabrication of inter-layer dielectric layers, conductive plugs and passivation layers, they are not mentioned since they are not a concern in the present invention.

In contrast to the prior art of fabricating the flash memory cell, the method of the present forms a stringer block 60 on the interface between the HDP silicon oxide layer 64 and the silicon substrate 50. Thus, the bottom corner stringer can be exposed following the removal of the stringer block 60 and removed by a dry etching process. As a result, a stringerless flash memory cell is formed to prevent leakage currents resulting from the bottom corner stringers according to the present invention. In addition, both the reliability and data retention ability of the flash memory cell are effectively improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a stringerless structure on a semiconductor substrate, the method comprising:

forming a first layer on the semiconductor substrate;

forming a spacer on each side wall of the first layer;

forming a second layer to cover the first layer and the spacer, the second layer being thicker than the first layer;

forming a patterned photoresist layer on the second layer;

using the patterned photoresist layer as a mask to perform an anisotropic dry etching process to remove portions of the second layer and the first layer and form a bottom corner stringer beside the spacer;

removing the spacer to expose the bottom corner stringer; and removing the bottom corner stringer.

2. The method of claim 1 wherein the first layer is a patterned gate.

3. The method of claim 1 wherein the spacer comprises silicon nitride.

4. The method of claim 1 wherein the second layer comprises a silicon oxide layer or a silicon oxide layer containing boron/phosphorous atoms.

5. The method of claim 1 wherein a thickness of the spacer ranges from 70 to 120 angstroms (Å) approximately.

6. A method of fabricating a stringerless flash memory, the method comprising:

providing a semiconductor substrate, the semiconductor substrate comprising a silicon oxide layer;

forming a plurality of rows of layer stacks on the silicon oxide layer, a shallow trench being formed between two adjacent layer stacks, each layer stack comprising a first polysilicon layer, a sacrificial layer and two side walls;

forming a spacer on each side wall of the layer stacks, the spacer having a predetermined thickness;

depositing a high density plasma (HDP) silicon oxide layer to cover the layer stacks and the shallow trenches;

planarizing the HDP silicon oxide layer to expose the sacrificial layer;

removing the sacrificial layer and a portion of the spacer, such that a remainder of the spacer forms a stringer block;

forming a second polysilicon layer on the first polysilicon layer, the first polysilicon layer combining with the second polysilicon layer to form a floating gate layer;

sequentially forming an insulating layer and a controlling gate layer on the floating gate layer;

performing an anisotropic dry etching process to remove portions of the controlling gate layer, the insulating layer and the floating gate layer, a bottom corner stringer being formed beside the stringer block during the etching process of the floating gate layer;

removing the stringer block to expose the bottom corner stringer; and removing the bottom corner stringer.

7. The method of claim 6 wherein the method further comprises an ion implantation process to form a buried bit line within the semiconductor substrate beneath the shallow trench.

8. The method of claim 7 wherein the ion implantation process is performed after the spacer is formed.

9. The method of claim 6 wherein a thickness of the spacer ranges from 70 to 120 angstroms (Å) approximately.

10. The method of claim 6 wherein a thickness of the stringer block is greater than 50 Å.

11. The method of claim 6 wherein a height of the stringer block ranges from 200 to 1000 Å approximately.

12. The method of claim 6 wherein the stringer block comprises silicon nitride.

13. The method of claim 6 wherein the sacrificial layer comprises silicon nitride.

\* \* \* \* \*